(12) United States Patent
Zelenz et al.

(10) Patent No.: US 6,323,743 B1
(45) Date of Patent: Nov. 27, 2001

(54) ELECTRONIC FILTER ASSEMBLY

(75) Inventors: Martin L. Zelenz, DeWitt; Jerry M. Gould, Liverpool; Andrew F. Tresness, Manlius, all of NY (US)

(73) Assignee: Tresness Irrevocable Patent Trust, Syracuse, NY (US)

( * ) Notice: Subject to any disclaimer, the term of this patent is extended or adjusted under 35 U.S.C. 154(b) by 0 days.

(21) Appl. No.: 09/382,064

(22) Filed: Aug. 24, 1999

(51) Int. Cl.⁷ .................................................... H03H 7/01
(52) U.S. Cl. ............................. 333/185; 333/172; 439/579
(58) Field of Search .................................. 333/168, 185, 333/169, 172; 439/579, 581, 578

(56) References Cited

U.S. PATENT DOCUMENTS

| | | | |
|---|---|---|---|
| 3,065,434 | 11/1962 | Calderhead | 333/70 |
| 3,522,485 | 8/1970 | De Metrick | 317/101 |
| 3,579,156 | 5/1971 | Parfitt | 333/79 |
| 4,063,201 | * 12/1977 | Komatsubara | 333/168 |
| 4,451,803 | 5/1984 | Holdsworth et al. | 333/12 |
| 4,701,726 | 10/1987 | Holdsworth | 333/185 |
| 4,799,904 | 1/1989 | Sutcliffe | 439/733 |
| 4,857,006 | 8/1989 | Linyeav et al. | 439/271 |
| 4,901,043 | 2/1990 | Palinkas | 333/175 |
| 5,088,937 | * 2/1992 | Gabany | 439/581 |
| 5,150,087 | * 9/1992 | Yoshie | 333/185 |
| 5,278,525 | 1/1994 | Palinkas | 333/175 |
| 5,620,339 | * 4/1997 | Gray | 439/578 |
| 5,662,494 | 9/1997 | Zennamo, Jr. | 439/589 |
| 5,668,408 | * 9/1997 | Nicholson | 257/699 |
| 5,745,838 | 4/1998 | Tresness et al. | 455/5.1 |
| 5,770,983 | 6/1998 | Zennamo, Jr. | 333/168 |
| 5,906,512 | * 5/1999 | Reynolds | 439/579 |

OTHER PUBLICATIONS

PPC SHP3–50 High Pass Filter Drawing, May 6, 1999.
Redesigned PPC SHP3 High Pass Filter Drawing, 1999.

\* cited by examiner

*Primary Examiner*—Justin P. Bettendorf
*Assistant Examiner*—Dean Takaoka
(74) *Attorney, Agent, or Firm*—Lawrence P. Trapani

(57) ABSTRACT

A filter assembly, comprising first and second terminal caps in opposing relation to each other. The caps are physically and electrically coupled to each other. First and second circuit boards are physically coupled to the first cap. The first circuit board includes—(i) front and rear surfaces, (ii) a first circuit located on either or both of the front and rear surfaces, (iii) a ground lead connected to the first circuit, and (iv) a first electrical terminal coupled to the first circuit. The second circuit board includes—(i) front and rear surfaces, (ii) a second circuit located on either or both of the front and rear surfaces, (iii) a ground lead connected to the second circuit, and (iv) a second electrical terminal coupled to the second circuit. The first and second circuits are electrically coupled to each other, and each are electrically coupled to the first terminal cap via the ground leads. The circuit boards are positioned substantially parallel to each other. The terminals extend into and are operatively supported inside the terminal caps, respectively.

29 Claims, 3 Drawing Sheets

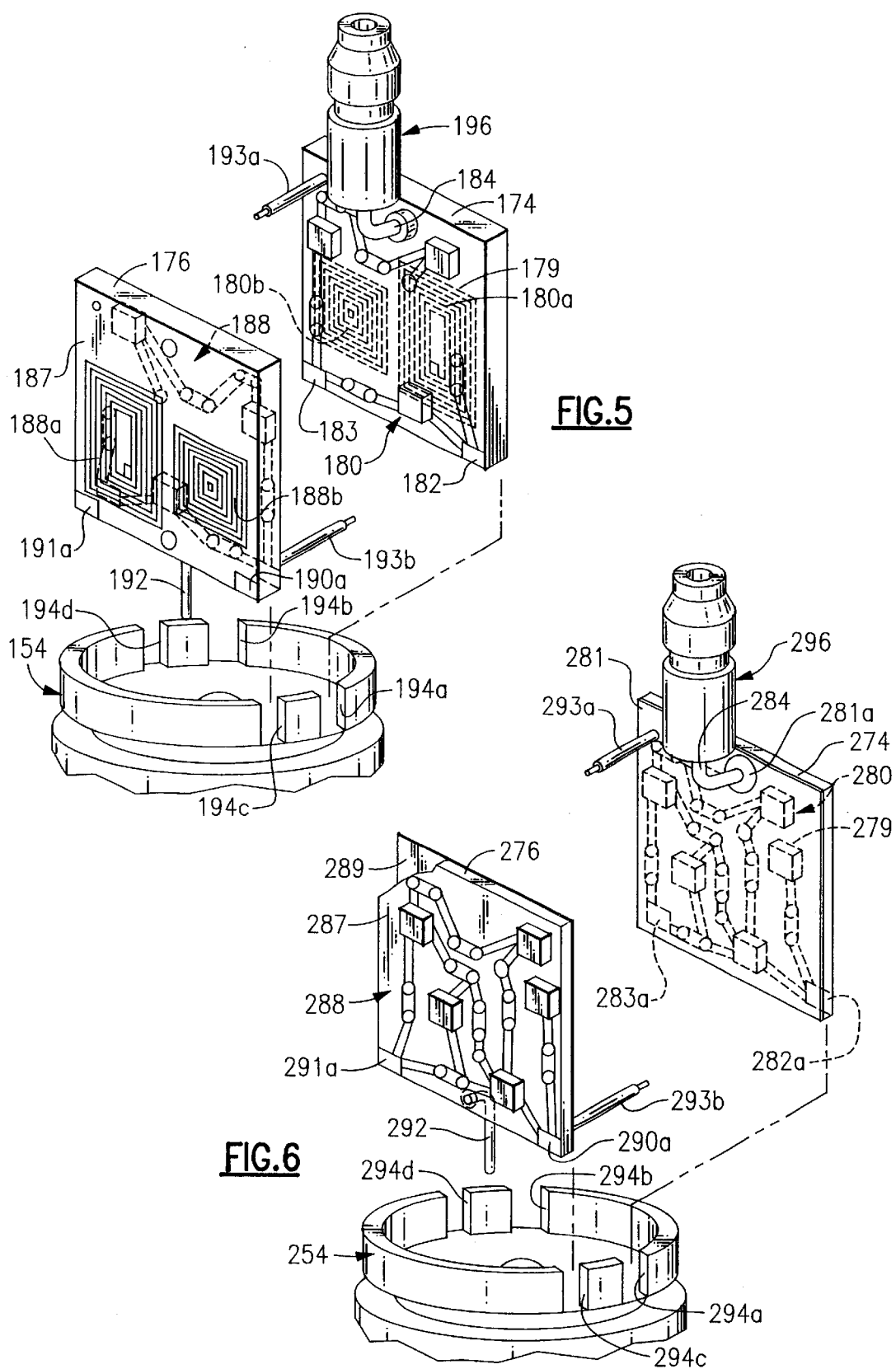

ELECTRONIC FILTER ASSEMBLY

BACKGROUND OF THE INVENTION

1. Technical Field

The present invention relates generally to electronic filters used in the cable television industry, and relates more particularly to the construction and assembly of such filters.

2. Background Art

Typical electronic filter constructions in the cable television (CATV) industry involve a considerable number of parts, such as, for example, one or more circuit boards, connecting wires or leads, filter circuit components, isolation plates, blocks or chambers, input and output terminals, moisture barrier seals or plugs, connector housings, sub-housings or caps, o-rings, outer housing sleeves, and potting material. This elaborate array of parts constrains efforts to: minimize the size and weight of the filters; reduce material and labor costs associated with assembly of the filters; and simplify and automate the assembly process. Examples of such filter constructions are shown and described in: U.S. Pat. No. 5,278,525 to Palinkas; U.S. Pat. No. 4,901,043 to Palinkas; U.S. Pat. No. 4,701,726 to Holdsworth; U.S. Pat. No. 4,451,803 to Holdsworth et al; U.S. Pat. No. 3,579,156 to Parfitt; and U.S. Pat. No. 3,065,434 to Calderhead.

For such CATV filters as highpass and lowpass filters, diplex filters, windowed highpass filters, and step attenuator (or return path) filters, tunable filter circuits and shielding between filter components and circuits are not normally required. Thus, for these types of filters, an opportunity is presented to simplify filter components, construction and assembly. U.S. Pat. No. 5,745,838 to Tresness and Zelenz (Zelenz is a named inventor of the present invention) discloses (FIGS. 8–10) a filter construction for a return path filter called a "step attenuator." This construction is also shown in FIG. 2 herein, as representing the prior art construction for this type of filter. While simplification was achieved in U.S. Pat. No. 5,745,838, the construction still required two major o-rings around the male and female terminal caps and an outer housing sleeve (See FIG. 2 herein); and, manual assembly of these parts was still required.

Many diplex, windowed highpass, and return path filters (See, e.g., embodiments shown in FIGS. 1–5 of U.S. Pat. No. 5,745,838), have dual (or "parallel") circuit paths. For example, FIG. 1, herein, shows a simplified step attenuator circuit 10 containing a forward (or highpass) path 12 and a return (or lowpass) path 14. Cascaded or elongated circuit board arrangements such as shown in U.S. Pat. No. 5,770,983 to Zennamo, Jr. et al., U.S. Pat. No. 4,901,043 to Palinkas, U.S. Pat. No. 4,701,726 to Holdsworth, U.S. Pat. No. 4,451,803 to Holdsworth et al., U.S. Pat. No. 3,579,156 to Parfitt, and U.S. Pat. No. 3,065,434 to Calderhead, are not optimum platforms for such dual path filters. A more optimum platform would be to have two circuit boards disposed in a parallel arrangement.

U.S. Pat. No. 5,278,525 to Palinkas discloses parallel circuit boards for a CATV notch filter (or "trap"), rather than for a dual path filter. The construction includes a considerable number of extra parts, such as an isolation shield, circuit board housings, tuning screw housings, o-rings, and an outer housing sleeve.

In most CATV applications, the filters are installed in an outdoor environment. Thus, it is important that the filter construction be moisture resistant. Efforts to make filters moisture resistant have included enclosing the filter in an outer housing sleeve and employing o-rings between the filter and the outer housing sleeve. See, e.g., U.S. Pat. No. 5,745,838 to Tresness et al., U.S. Pat. No. 5,278,525 to Palinkas, U.S. Pat. No. 4,701,726 to Holdsworth, and U.S. Pat. No. 4,451,803 to Holdsworth et al. Such an approach requires the additional parts and expense of o-rings and outer housing sleeves, and may require manual assembly of such parts.

A prime path for moisture penetration into the filter is through the terminal fittings or connectors. While efforts to prevent moisture penetration through filter connectors (such as disclosed in U.S. Pat. No. 5,278,525 to Palinkas) have been satisfactory, there remains a need to improve moisture resistance through these connector paths.

Another consideration in CATV filter construction is to establish a good and reliable electrical ground between the filter circuit or circuits and the filter housing. Electrical ground has been established by soldering or fitting isolation shields or blocks between the circuit boards and the filter housing, or by soldering wires or leads between the circuit board and housing. See, for example, U.S. Pat. No. 4,701,726 to Holdsworth. However, such methods usually require additional components or manual assembly steps.

OBJECTS AND SUMMARY OF THE INVENTION

It is therefore an object of the present invention to provide an electronic filter construction that avoids the limits and problems associated with the prior art.

It is another object of the present invention to provide an electronic filter construction that is more suitable for automated assembly than previous filter constructions.

It is a further object of the present invention to provide an electronic filter construction that requires less parts than previous filter constructions.

It is still another object of the present invention to reduce material and labor costs associated with the assembly of an electronic filter;

It is still a further object of the present invention to reduce the size and weight of an electronic filter;

It is yet another object of the present invention to provide an electronic filter construction that is optimum for dual (or parallel) path filter circuits;

It is yet a further object of the present invention to provide an electronic filter construction that establishes an effective and reliable ground connection between the filter's circuitry and the filter housing; and It is still yet another object of the present invention to provide an electronic filter construction that has improved moisture resistance.

These and other objects are attained in accordance with the present invention wherein there is provided a filter assembly, comprising (1) a first terminal cap, (2) a second terminal cap, (3) a first circuit board, and (4) a second circuit board. The first and second terminal caps are disposed along a longitudinal axis in opposing relation to each other. The terminal caps are physically and electrically coupled to each other.

Both circuit boards are physically coupled to the first terminal cap. The first circuit board includes—(i) front and rear surfaces, (ii) a first filter circuit located on either or both of the front and the rear surfaces, (iii) a ground contact electrically coupled to the first filter circuit and to said first terminal cap, and (iv) a first filter terminal coupled to the first circuit. The second circuit board includes—(i) front and rear surfaces, (ii) a second filter circuit located on either or both of the front and the rear surfaces, (iii) a ground contact electrically connected to the second filter circuit and to said first terminal cap, and (iv) a second filter terminal coupled to the second circuit. The first and second circuits are electrically coupled to each other, and each circuit is electrically coupled to the first terminal cap via the ground contacts such that the circuits have a common ground through the first terminal cap.

The first and second circuit boards are positioned substantially parallel to each other and to the longitudinal axis, between the terminal caps. The front surface of the first circuit board substantially faces the front surface of the second circuit board. The first and second terminals extend into and are operatively supported inside the first and second terminal caps, respectively.

In a modified embodiment, the filter assembly of the present invention may include only a single circuit board physically coupled to the first terminal cap. In such an embodiment, the single circuit board would include—(i) front and rear surfaces, (2) a filter circuit located on either or both of the front and rear surfaces, (iii) a ground contact electrically coupled to the filter circuit and to the first terminal cap, and (iv) first and second filter terminals electrically coupled to the filter circuit. The filter circuit is electrically coupled to the first terminal cap via the ground lead, such that the circuit is grounded through the first terminal cap. The single circuit board is positioned substantially parallel to the longitudinal axis, between the terminal caps. The first and second terminals extend into and are operatively supported inside the first and second terminal caps, respectively.

In an alternative embodiment, a filter assembly is provided, which comprises—(1) first and second terminal caps, (2) a filter circuit, (3) first and second filter terminals, (4) first and second sealing members, and (5) an o-ring. The first and second terminal caps are arranged in opposing relation to each other. The first cap is directly connected to the second cap to form a filter housing which defines an interior volume. The first cap contains an external groove, and the connection between the first and second caps is substantially sealed by solder received in the groove. The caps contain first and second terminal passages, respectively, between the interior volume and the exterior of the filter assembly.

A filter circuit is mounted inside the filter housing. The filter terminals are electrically coupled to the filter circuit. The first and second terminals extend through and are operatively supported inside the first and second terminal passages, respectively. The first sealing member is secured in and substantially closes the first terminal passage. The first sealing member contains a hole through which the first terminal tightly fits. The second sealing member is secured in and substantially closes the second terminal passage. The second sealing member contains a hole through which the second terminal tightly fits. The o-ring is seated inside the second terminal passage, between the second sealing member and the second terminal cap.

BRIEF DESCRIPTION OF THE DRAWING

Further objects of the present invention will become apparent from the following description of the preferred embodiment with reference to the accompanying drawing, in which:

FIG. 5 is an exploded view showing a modification to the filter of FIG. 4; and

FIG. 6 is an exploded view showing another modification to the filter of FIG. 4.

DETAILED DESCRIPTION OF THE PREFERRED EMBODIMENT

Figure 1:
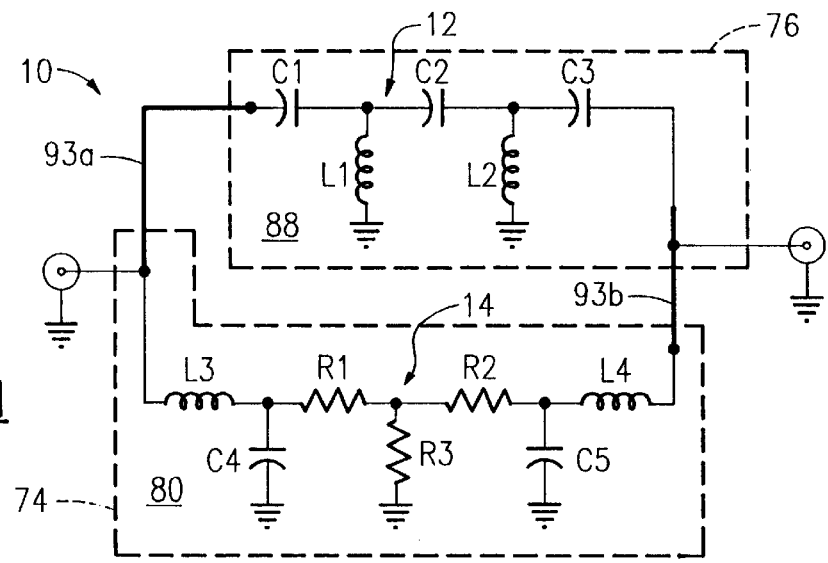
FIG. 1 is a schematic diagram of a dual-path filter circuit.

The filter assembly of the present invention is especially suited for dual (or parallel) path filter circuits. As understood in the art, dual path circuits include at least two separate circuit paths. Examples of dual path filters are diplex, windowed highpass, and some step attenuator filters. Referring now to FIG. 1, there is shown a schematic of a dual path filter circuit 10, having a highpass circuit path 12 and a lowpass circuit path 14. Circuit 10 is a simplified version of a step attenuator circuit described in U.S. Pat. No. 5,745,838 to Tresness et al., incorporated herein by reference. The present invention is not limited to filter assemblies for any particular filter circuit. Circuit 10 is presented only as an example of a dual path circuit. An understanding of circuit 10 is not necessary for an understanding of the present invention.

Figure 2:
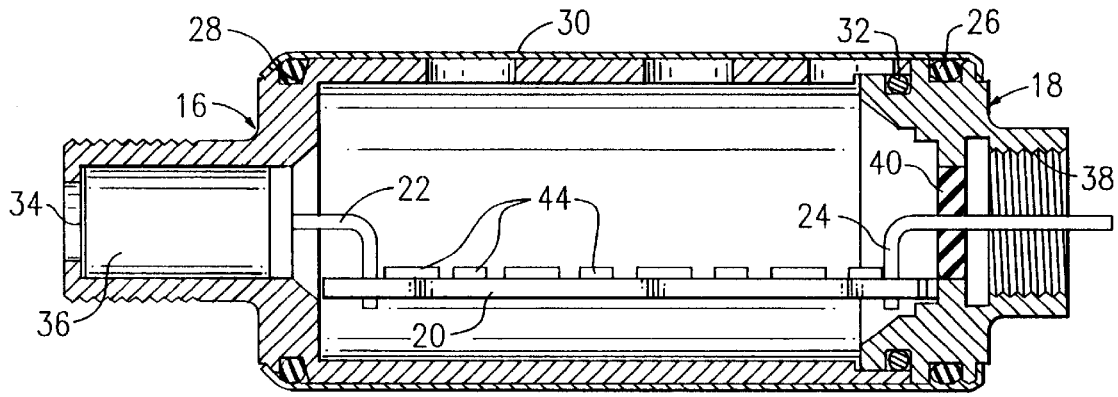
FIG. 2 is a longitudinal cross-sectional view of a filter constructed in accordance with the teachings of the prior art.

FIG. 2 shows a sectional view of a conventional filter construction. The construction includes a female terminal cap 16, a male terminal cap 18, an elongated circuit board 20, a female terminal 22, a male terminal 24, o-rings 26 and 28, and an outer housing sleeve 30. Terminal caps 16 and 18 are soldered together by way of a solder ring 32. Female terminal 22 is connected to a female connector assembly 34 which includes a sealing member 36. Male terminal 24 extends through an internally threaded fitting 38 contained in cap 18. Terminal 24 is tightly fitted through a sealing wafer 40 secured inside cap 18. The filter shown in FIG. 2 is of the type that does not require shielding or tunable filter components. As a result, low profile, surface mounted filter components 44 are used. It is apparent from FIG. 2 that this conventional construction produces an enormous amount of wasted internal space, and the elongated shape of circuit board 20 constrains efforts to reduce the length of the filter.

Figures 3A, 3B:
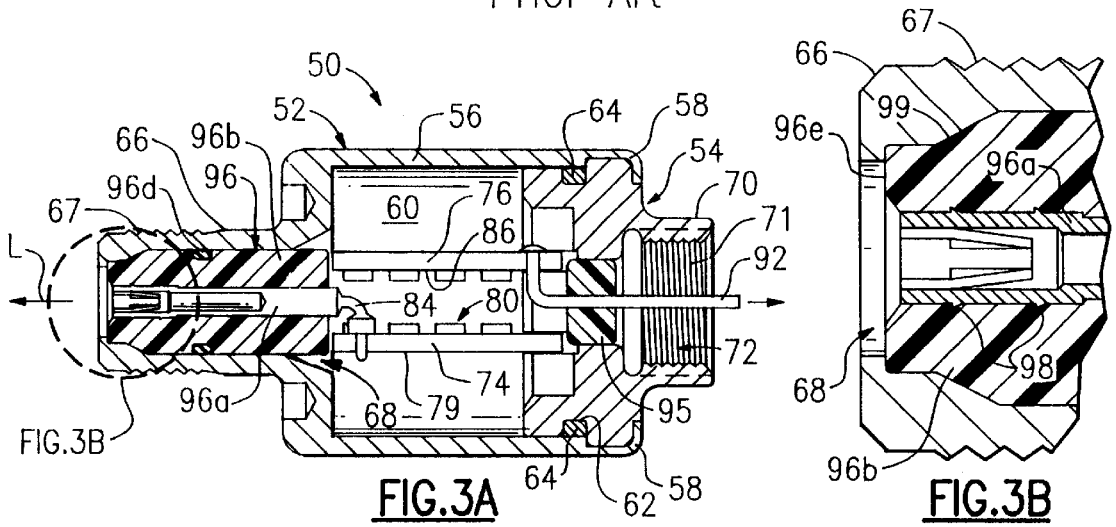
FIG. 3A is a longitudinal cross-sectional view of a filter constructed in accordance with the present invention.
FIG. 3B is an enlarged cross-sectional view of the circled area in FIG. 3A.

The conventional filter construction of FIG. 2 is contrasted markedly by the filter construction of the present invention, shown in FIG. 3A. FIG. 3A depicts the preferred embodiment of the present invention. It does not include the outer housing sleeve and accompanying o-rings. The elimination of these parts simplifies the assembly and allows the filter manufacturer to adopt a more automated assembly process.

Figure 4:
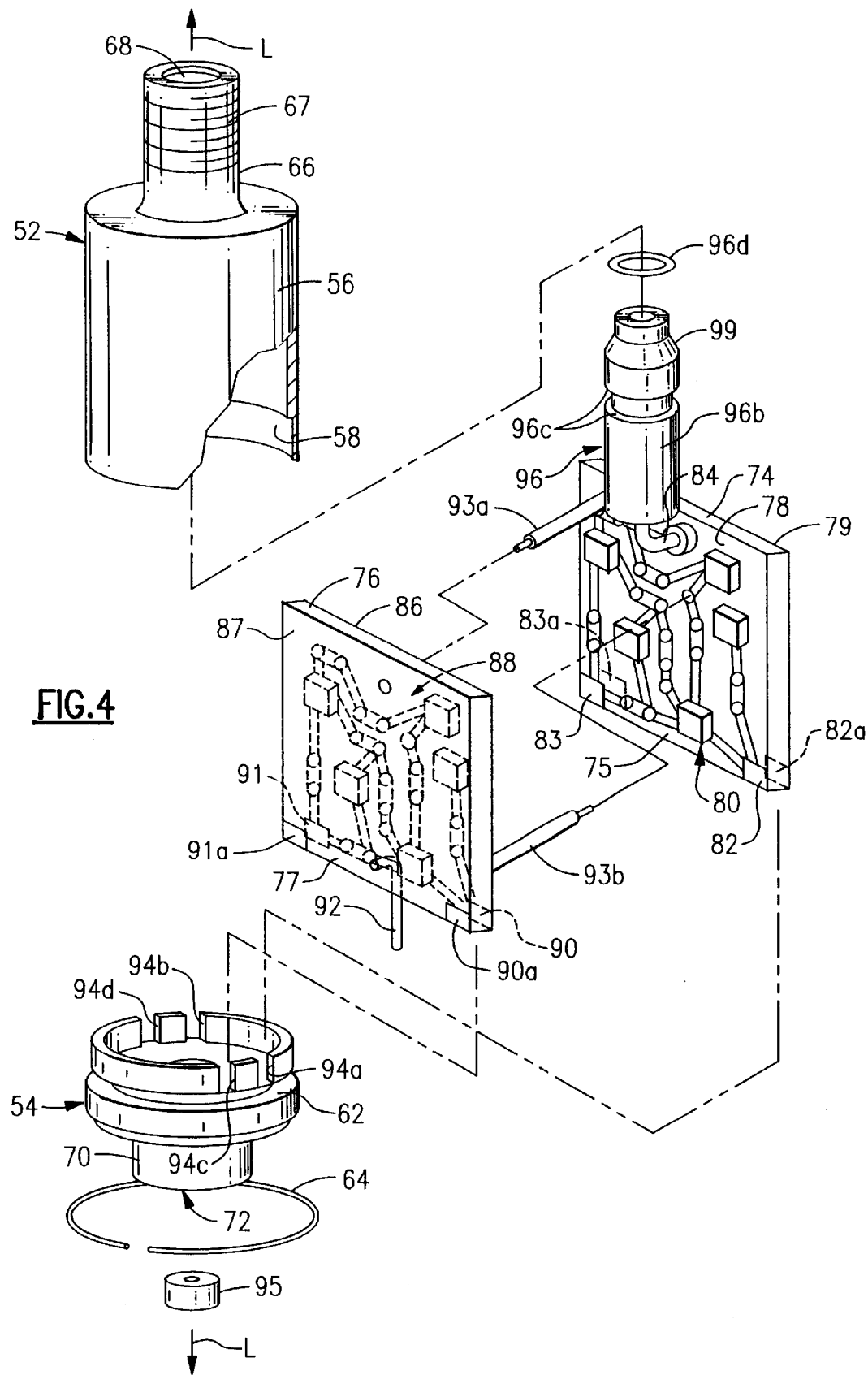
FIG. 4 is an exploded view of the filter shown in FIG. 3A.

The preferred construction will now be described in detail with reference to FIGS. 3A, 3B and 4. A filter 50 includes a female terminal cap 52 and a male terminal cap 54. Caps 52 and 54 are disposed along a longitudinal axis L, in opposing relation to each other. Caps 52 and 54 are made of any suitable conductive metal typically used in the filter industry. Cap 52 includes a cylindrical portion 56 having an extension or crimping sleeve 58. Cylindrical portion 56 extends to cap 54, and sleeve 58 is crimped around cap 54, to form a filter housing with an interior volume 60 (FIG. 3A). Cap 54 contains an external circumferential groove 62 (FIGS. 3A and 4). Caps 52 and 54 are sealed together using a solder ring 64 received in groove 62. A circumferential solder joint is established with ring 64, by way of induction soldering. The solder joint also establishes a good electrical ground connection between caps 52 and 54. Induction soldering is preferred because it can be implemented as an automated assembly step. As a result of the above-described crimping and soldering, a secure physical and electrical connection is established between caps 52 and 54.

Female terminal cap 52 includes a fitting portion 66 containing external threads 67 and a terminal passage 68. Male terminal cap 54 includes a fitting portion 70 containing internal threads 71 and a terminal passage 72. Passages 68 and 72 each establish a passageway between interior volume 60 and the exterior of filter 50.

As shown in FIG. 3A, a pair of filter circuit boards 74, 76 are enclosed in interior volume 60. Circuit boards 74, 76 are arranged substantially parallel to each other and to longitudinal axis L. In this disclosure and in the claims, the term "parallel" is not intended to mean precisely parallel. The term includes orientations that may produce acute angles between the circuit boards.

As best shown in FIG. 4, circuit board 74 includes—(i) front and rear surfaces 78, 79, (ii) a filter circuit 80 located on front surface 78, (iii) a pair of ground contacts 82, 83 electrically connected to circuit 80, and (iv) a terminal 84 electrically coupled to circuit 80. Circuit board 76 includes—(i) front and rear surfaces 86, 87, (ii) a filter circuit 88 located on front surface 86, (iii) a pair of ground contacts 90, 91 electrically connected to circuit 88, and (iv) a terminal 92 electrically coupled to circuit 88. It is preferred that another, corresponding pair of ground contacts be located on the rear surfaces of boards 74, 76, respectively (see corresponding contacts 82a, 83a and 90a, 91a in FIG. 4). These corresponding pairs of contacts are likewise electrically connected to their respective filter circuits (80, 88). Circuit 80 is connected to circuit 88 by way of jumper wires 93a, 93b (FIG. 4), to form a complete filter circuit (such as shown in FIG. 1). Circuits 80, 88 are preferably implemented with all surface mounted filter components, including fixed-tuned chip (ceramic medium) inductors and/or ferrite core inductors.

Dual filter circuit 10 (FIG. 1) can be neatly arranged on circuit boards 74, 76, as indicated by the broken lines in FIG. 1. As represented in FIG. 1, circuit board 74 contains circuit path 14 which is embodied in circuit 80, and circuit board 76 contains circuit path 12 which is embodied in circuit 88. These paths are joined together by jumper wires 93a, 93b (FIG. 1). It is to be noted that the present invention is not limited to dual path circuits or to the separation of dual circuit paths on respective circuit boards. Any operable arrangement may be employed. When we refer to a "filter circuit" or "circuit" on a circuit board, in this disclosure and in the claims, it is intended to mean any arrangement of a circuit component or circuit components, whether or not constituting a complete or identifiable filter circuit. The example presented in this disclosure is merely to illustrate the suitability of the parallel circuit board arrangement (of the present invention) to a dual path circuit.

Circuit boards 74, 76 are mounted directly to male terminal cap 54. As best shown in FIG. 4, circuit boards 74, 76 have mating ends 75, 77, respectively, and the ground contacts are located at the mating ends. Terminal cap 54 contains two pairs of opposed notches 94a, 94b and 94c, 94d. For the purpose of this disclosure and the claims, the term "groove" shall include its normally intended meanings and, in addition, it shall include notch pairs, such as notch pairs 94a, 94b and 94c, 94d. Thus, e.g., notch pair 94a, 94b may be properly referred to herein as groove 94a, 94b.

Grooves 94a, 94b and 94c, 94d are configured to receive, in a tight press fit, the mating ends of circuit boards 74, 76, respectively. This tight press fit secures the circuit boards in position.

Circuits 80, 88 are electrically coupled to terminal cap 54 via the ground contacts, and thus establish a common electrical ground for circuits 80, 88. Ground contacts 82, 82a and 83, 83a are in registration and direct contact with notches 94a and 94b, respectively, and ground contacts 90, 90a and 91, 91a are in registration and direct contact with notches 94c and 94d, respectively. Each of the ground contacts is coated with solder when circuit boards 74, 76 are produced. The solder coating ensures a tight fit between the contacts and the notches. In fact, during assembly, the some of the solder is sheared off during insertion of boards 74, 76 into notches process 94a, 94b and 94c, 94d. The ground contacts are soldered to the notches by induction soldering (another automated assembly step). This arrangement establishes a good ground connection between the circuit boards and cap 54.

Terminal 92 is a male connector terminal which extends through and is operatively supported inside terminal passage 72. A potting wafer 95, made of low density polyethylene, is inserted into and substantially closes off terminal passage 72. Wafer 95 contains an open bore through which terminal 92 tightly fits. Once installed, wafer 95 seals passage 72, substantially preventing moisture from entering filter 50 through passage 72.

Terminal 84 includes a female terminal assembly 96 which extends through and is operatively supported inside terminal passage 68. Terminal assembly 96 includes a female connector element or collet terminal 96a, an polypropylene insulator 96b containing an external o-ring groove 96c (FIG. 4), and an o-ring 96d seated in groove 96c. Assembly 96 is inserted into and substantially closes off terminal passage 68. Insulator 96b and o-ring 96d, together, seal passage 68, substantially preventing moisture from entering the filter between passage 68 and insulator 96b. Insulator 96b contains an open bore through which collet terminal 96a tightly fits.

As shown in FIG. 3B, collet terminal 96a has a pair circumferential (360°), protruding barbs or ribs 98. Collet 96a is press fitted through the bore of insulator 96b, causing barbs 98 to penetrate and anchor into insulator 96b (FIG. 3B). "Penetration" of barbs 98 may or may not include breaking into the insulator material—typically, the barbs will penetrate the insulator by deforming the insulator material. The barbs, and their penetration into the insulator, help prevent moisture from entering filter 50, between the bore of insulator 96b and collet 96a.

As shown in FIGS. 3B and 4, insulator 96b has a cone-shaped nose 99, which allows o-ring 96d to be easily slipped over the insulator and seated in groove 96c. This cone-shape allows o-ring 96d to be installed on the insulator by an automated assembly step. In some filter constructions, it may be preferable to have collet 96a extend through the insulator to the point where it is flush with an insulator face 96e (See FIG. 3B). The construction, as above-described, may eliminate the need for potting material inside the filter, in most applications.

Referring now to FIG. 5, there is shown a modification to the embodiment of FIG. 4. Like parts are indicated by like reference numbers, increased by 100. The modification concerns the placement of printed circuit inductors on the rear surface of each circuit board. As shown in FIG. 5, circuits 180, 188 each include a pair of printed inductors 180a, 180b and 188a, 188b, respectively, etched on respective rear surfaces 179 and 187. Inductors 180a, 180b and 188a, 188b may serve, for example, as inductors L3, L4 and L1, L2, respectively, in the circuit shown in FIG. 1. In this embodiment, the capacitors of circuits 180, 188 would remain on the front surfaces of circuit boards 174, 176. The embodiment of FIG. 5 is otherwise the same as the embodiment of FIGS. 3A, 3B and 4.

Referring now to FIG. 6, there is shown another modification of the embodiment of FIG. 4. Like parts are indicated by like reference numbers, increased by 200. In some applications, it may be desirable to have a certain degree of electromagnetic shielding between circuit boards. This can be achieved by locating the filter circuits on the rear surfaces of the circuit boards and locating ground planes on the front surfaces of the boards. As shown in FIG. 6, circuits 280, 288 are located on rear surfaces 279, 287, respectively, and ground planes 281, 289 are located on the front surfaces of boards 274, 276, respectively. The ground planes provide shielding between circuits 280, 288. Ground planes 281, 289 are grounded by their direct physical contact with notches 294a, 294b and 294c, 294d, respectively, when boards 274, 276 are seated in the notches. Thus, separate ground contacts are not necessary on the front surfaces of the boards. As shown in FIG. 6, ground contacts 282a, 283a and 290a, 291a are located on the rear surfaces of boards 274 and 276, respectively.

A circular opening 281a is contained in ground plane 281 to allow terminal 284 to be connected to board 274 without shorting to ground. A similar opening is provided in ground plane 289 for terminal 292. Openings are also contained in the ground planes to accommodate jumper wires 293a, 293b. The embodiment of FIG. 6 is otherwise the same as the embodiment of FIGS. 3A, 3B and 4.

While the preferred embodiment of the invention has been particularly described in the specification and illustrated in the drawing, it should be understood that the invention is not so limited. Many modifications, equivalents, and adaptations of the invention will become apparent to those skilled in the art without departing from the spirit and scope of the invention.

What is claimed is:

1. A filter assembly, comprising:

first and second terminal caps arranged in opposing relation to each other, said first cap being directly connected to said second cap to form a filter housing which defines an interior volume, said first cap containing an external groove, and the connection between said first and said second caps being substantially sealed by solder received in the groove, said first and said second caps containing first and second terminal passages, respectively, between the interior volume and the exterior of said filter assembly;

a filter circuit mounted inside said filter housing;

first and second filter terminals electrically coupled to said filter circuit, said first and said second terminals extending through and being operatively supported inside the first and the second terminal passages, respectively;

a first sealing member secured in and substantially closing the first terminal passage, said sealing member containing a hole through which the first terminal tightly fits;

a second sealing member secured in and substantially closing the second terminal passage, said second sealing member containing a hole through which the second terminal tightly fits; and an o-ring seated inside said second terminal passage, between the second sealing member and said second terminal cap.

2. The filter assembly of claim 1, wherein said second filter terminal is a collet terminal having a barb protruding therefrom, said barb penetrating said second sealing member from inside the hole of said second sealing member.

3. A filter assembly, comprising:

first and second terminal caps disposed along a longitudinal axis in opposing relation to each other, said first and said second terminal caps being physically and electrically coupled to each other;

a first circuit board mated with said first terminal cap, said first circuit board including—(i) front and rear surfaces, (ii) a first filter circuit located on either or both of the front and the rear surfaces, (iii) a ground contact electrically coupled to the first filter circuit and to said first terminal cap, and (iv) a first filter terminal electrically coupled to the first filter circuit; and a second circuit board mated with said first terminal cap, said second circuit board including—(i) front and rear surfaces, (ii) a second filter circuit located on either or both of the front and the rear surfaces, (iii) a ground contact electrically coupled to the second filter circuit and to said first terminal cap, and (iv) a second filter terminal electrically coupled to the second filter circuit, the first and the second filter circuits being electrically coupled to each other, and each of the circuits being electrically coupled to said first terminal cap via the ground contacts such that the circuits have a common electrical ground through the first terminal cap, said first and said second circuit boards being positioned substantially parallel to each other and to the longitudinal axis between said first and said second terminal caps, the front surface of said first circuit board substantially facing the front surface of said second circuit board, the first terminal extending into and being operatively supported inside said first terminal cap, and the second terminal extending into and being operatively supported inside said second terminal cap.

4. The filter assembly of claim 3, wherein said first and said second circuit boards each include a mating end, the ground contacts of said first and said second circuit boards being located at the mating ends, respectively, and wherein said first terminal cap contains first and second grooves configured to receive, in a tight press fit, the mating ends of said first and said second circuit boards, respectively, whereby the tight press fit secures said first and said second circuit boards in position.

5. The filter assembly of claim 4, wherein said first circuit board includes a plurality of ground contacts electrically connected to the first filter circuit, the ground contacts being located at the mating end of the first circuit board and being in direct physical contact with the first groove of said first terminal cap.

6. The filter assembly of claim 5, wherein said second circuit board includes a plurality of ground contacts electrically connected to the second filter circuit, the ground contacts being located at the mating end of the second circuit board and being in direct physical contact with the second groove of said first terminal cap.

7. The filter assembly of claim 3, wherein the first filter circuit is located on the front surface of said first circuit board, and wherein the second filter circuit is located on the front surface of said second circuit board.

8. The filter assembly of claim 3, wherein a metal ground plane is situated on the front surface of said first circuit board, and wherein the first filter circuit is located on the rear surface of said first circuit board.

9. The filter assembly of claim 8, wherein a metal ground plane is situated on the front surface of said second circuit board, and wherein the second filter circuit is located on the rear surface of said second circuit board.

10. The filter assembly of claim 3, wherein the first filter circuit includes a plurality of inductors, and wherein at least one of the inductors is printed on either the front or the rear surface of said first circuit board.

11. The filter assembly of claim 3, wherein the first circuit includes a plurality of inductors and a plurality of capacitors, and wherein the plurality of inductors are printed on the rear surface and the plurality of capacitors are located on tie front surface of said first circuit board.

12. The filter assembly of claim 11, wherein the second circuit includes a plurality of inductors and a plurality of capacitors, and wherein the plurality of inductors are printed on the rear surface and the plurality of capacitors are located on the front surface of said second circuit board.

13. The filter assembly of claim 3, wherein said second terminal cap extends to and is directly connected to said first terminal cap, to form a filter housing which encloses said first and said second circuit boards in an interior volume.

14. The filter assembly of claim 13, wherein the connection between said second and said first terminal caps is substantially sealed by solder received in a groove contained in said first cap.

15. The filter assembly of claim 13, wherein said first terminal cap contains a first terminal passage between the interior volume of the filter housing and the exterior of said filter assembly, the first terminal extending through the first terminal passage, and wherein said first terminal cap includes a sealing member secured in and substantially closing the first passage, said sealing member containing a hole through which the first terminal tightly fits.

16. The filter assembly of claim 15, wherein said second terminal cap contains a second terminal passage between the interior volume of the filter housing and the exterior of said filter assembly, the second terminal extending through the second terminal passage, and wherein said second terminal cap includes a sealing member secured in and substantially closing the second passage, said sealing member containing a hole through which the second terminal tightly fits.

17. The filter assembly of claim 16, wherein the sealing member of said second terminal cap is an elongated insulator containing a hole therethrough.

18. The filter assembly of claim 17, further comprising an o-ring seated inside said second terminal passage, between the insulator and said second terminal cap.

19. The filter assembly of claim 17, wherein the second filter terminal has a barb protruding therefrom, which penetrates the insulator from inside the hole of the insulator.

20. A filter assembly, comprising:
first and second terminal caps disposed along a longitudinal axis in opposing relation to each other, said first and said second terminal caps being physically and electrically coupled to each other;
a first circuit board directly connected to said first terminal cap, said first circuit board including—(i) front and rear surfaces, (ii) a first filter circuit located on either or both of the front and the rear surfaces, (iii) a ground contact electrically coupled to the first filter circuit and to said first terminal cap, and (iv) a first filter terminal electrically coupled to the first filter circuit; and
a second circuit board directly connected to said first terminal cap, said second circuit board including—(i) front and rear surfaces, (ii) a second filter circuit located on either or both of the front and the rear surfaces, (iii) a ground contact electrically coupled to the second filter circuit and to said first terminal cap, and (iv) a second filter terminal electrically coupled to the second filter circuit,
the first and the second filter circuits being electrically coupled to each other, and each of the circuits being electrically coupled to said first terminal cap via the ground contacts such that the circuits have a common electrical ground through the first terminal cap,
said first and said second circuit boards being positioned substantially parallel to each other and to the longitudinal axis between said first and said second terminal caps, the front surface of said first circuit board substantially facing the front surface of said second circuit board,
the first terminal extending into and being operatively supported inside said first terminal cap, and the second terminal extending into and being operatively supported inside said second terminal cap.

21. A filter assembly, comprising:
first and second electrically conductive terminal caps disposed along a longitudinal axis in opposing relation to each other, said first and said second terminal caps being physically and electrically coupled to each other to form a filter housing with an interior volume, said first terminal cap containing first and second grooves;
first and second electrical terminals extending into the interior volume of the filter housing and being operatively supported inside said first and said second terminal caps, respectively;
a first circuit board, contained in the filter housing, including—(i) a first end, (ii) a first filter circuit, and (iii) a first ground contact located at the first end and electrically coupled to the first circuit, wherein the first end of said first circuit board is physically coupled to said first terminal cap at the first groove, such that the first ground contact is electrically coupled to said first terminal cap; and
a second circuit board, contained in the filter housing, including—(i) a first end, (ii) a second circuit, and (iii) a second ground contact located at the first end and electrically coupled to the second circuit, wherein the first end of said second circuit board is physically coupled to said first terminal cap at the second groove, such that the second ground contact is electrically coupled to said first terminal cap;
the first and the second filter circuits being electrically coupled to each other to form a dual path filter circuit, wherein the first filter circuit provides one circuit path and the second filter circuit provides another circuit path of the dual path filter circuit, the dual path circuit being electrically coupled to said first and said second electrical terminals,
the first and the second filter circuits being electrically coupled to said first terminal cap via the first and the second ground contacts, such that the circuits have a common electrical ground through the first terminal cap, and
said first and said second circuit boards being positioned substantially parallel to each other and to the longitudinal axis between said first and said second terminal caps.

22. The filter assembly of claim 21, wherein the first end of said first circuit board and the first end of said second circuit board are mated with the first and the second grooves of said first terminal cap, respectively.

23. The filter assembly of claim 21, wherein the first end of said first circuit board and the first end of said second circuit board are directly connected to the first and the second grooves of said first terminal cap, respectively.

24. The filter assembly of claim 21, wherein the first end of said first circuit board and the first end of said second circuit board are press fitted into the first and the second grooves of said first terminal cap, respectively.

25. The filter assembly of claim 21, wherein the dual path filter circuit is a step attenuator circuit having a highpass circuit path and a lowpass circuit path, the first filter circuit providing the highpass circuit path and the second filter circuit providing the lowpass circuit path.

26. The filter assembly of claim 21, wherein the dual path filter circuit is a diplex filter circuit.

27. The filter assembly of claim 21, wherein the dual path filter circuit is a windowed highpass circuit.

28. A filter assembly, comprising:

a filter housing containing an interior volume and having an electrically conductive terminal cap, the terminal cap containing first and second grooves;

first and second electrical terminals being operatively supported inside said filter housing and extending into the interior volume thereof;

a first circuit board, contained in the filter housing, including—(i) a first end, (ii) a first filter circuit, and (iii) a first ground contact located at the first end and electrically coupled to the first circuit, wherein the first end of said first circuit board is physically coupled to the terminal cap at the first groove, such that the first ground contact is electrically coupled to the terminal cap; and a second circuit board, contained in the filter housing, including—(i) a first end and (ii) a second circuit, wherein the first end of said second circuit board is physically coupled to the terminal cap at the second groove;

the first and the second filter circuits being electrically coupled to each other to form a dual path filter circuit, wherein the first filter circuit provides one circuit path and the second filter circuit provides another circuit path of the dual path filter circuit, the dual path circuit being electrically coupled to said first and said second electrical terminals and being grounded to the terminal cap via the first ground contact.

29. The filter assembly of claim 28, wherein said second circuit board further includes a second ground contact located at the first end of said second circuit board and electrically coupled to the second circuit, the first end of said second circuit board being physically coupled to the terminal cap at the second groove such that the second ground contact is electrically coupled to the terminal cap.

* * * * *